United States Patent [19]

Thomas

[11] 4,117,257
[45] Sep. 26, 1978

[54] TEMPERATURE SENSOR HOLDING DEVICE

[75] Inventor: Harry L. Thomas, Alexander, N.Y.

[73] Assignee: GTE Sylvania Incorporated, Stamford, Conn.

[21] Appl. No.: 686,746

[22] Filed: May 17, 1976

[51] Int. Cl.² .............................................. H05K 5/00
[52] U.S. Cl. ........................... 174/52 R; 174/16 HS; 73/343 R; 361/388
[58] Field of Search ................. 174/16 HS, 52 R, 50, 174/67; 357/81; 73/431, 343 R; 165/80; 361/388, 389

[56] References Cited

U.S. PATENT DOCUMENTS

| | | | |
|---|---|---|---|
| 2,487,900 | 11/1949 | Sopher | 174/67 |
| 2,524,250 | 10/1950 | Bierce | 174/67 X |
| 2,916,733 | 12/1959 | Hirsch | 174/67 X |
| 3,252,611 | 5/1966 | Weitzman | 174/67 X |
| 3,859,570 | 1/1975 | Veranth | 357/81 X |
| 3,901,080 | 8/1975 | Hilborn | 73/343 R |

Primary Examiner—J. V. Truhe
Assistant Examiner—David A. Tone
Attorney, Agent, or Firm—John A. Odozynski

[57] ABSTRACT

A temperature sensor holding device for electronic apparatus includes a plate member having an aperture for receiving a heat generating semi-conductor and formed for attachment to a heat sink, a spacer member fastened to the plate member and formed to telescope over the heat generating semi-conductor, and a cover member formed for attachment to the spacer and plate members and having a cut out portion on the inner surface thereof for receiving a temperature sensor device.

7 Claims, 3 Drawing Figures

TEMPERATURE SENSOR HOLDING DEVICE

BACKGROUND OF THE INVENTION

In electronic apparatus having amplifier stages with relatively large power output capabilities, such as audio amplifier for example, a commonly encountered problem is a thermal run away condition of the amplifier device. Frequently, the idle current of the device is sufficient to cause this thermal run away condition which destroys the device.

One approach to solving the thermal run away problem is the use of a semi-conductor to sense a temperature change in the output device. Upon sensing the temperature change, the temperature sensor semi-conductor feeds back a signal which automatically controls the idle current of the output device and inhibits any tendency toward the run away condition.

In the prior art, a well-known technique for inhibiting thermal run away in an assembled power amplifier and temperature sensitive semi-conductor device, was to affix the power amplifier to the heat sink with a mica insulator between the heat sink and the amplifier. Also, the temperature sensitive device was affixed to the heat sink by a mounting bracket. Thus, the thermal path from the output device to the temperature sensitive device included (a) the case of the output device, (b) a mica insulator, (c) the heat sink, (d) through a portion of the heat sink, (e) a sensor device mounting bracket, and (f) the temperature sensitive device.

Obviously, such an extended thermal path includes numerous variables and the variables are different for each configuration. As a result, the response of the temperature sensitive device is different for each configuration and the time lag of the correction circuit may be of a length sufficient to cause failure of the power amplifier before the temperature sensitive device has had time to effect the correction.

OBJECTS AND SUMMARY OF THE INVENTION

An object of the present invention is to enhance the temperature sensing capabilities of electronic apparatus. Another object of the invention is to provide an improved capability for mounting a heat generating semi-conductor and temperature sensor device. Still another object of the invention is to provide an improved thermal path between a heat generating semi-conductor and a temperature sensor device.

These and other objects, advantages and capabilities are achieved in one aspect of the invention by a temperature sensor holding device having an apertured plate member affixed to an aperture spacer member telescoped over a heat generating semi-conductor attaching with the plate and spacer members and semi-conductor attached to a heat sink and a cover member having an inner surface cut out for a temperature sensitive device aligned with the aperture for receiving the heat generating semi-conductor and formed for attachment to the spacer and plate members.

PREFERRED EMBODIMENT OF THE INVENTION

For a better understanding of the present invention, together with other and further objects, advantages and capabilities thereof, reference is made to the following disclosure and appended claims in conjunction with the accompanying drawings.

Figure 1:
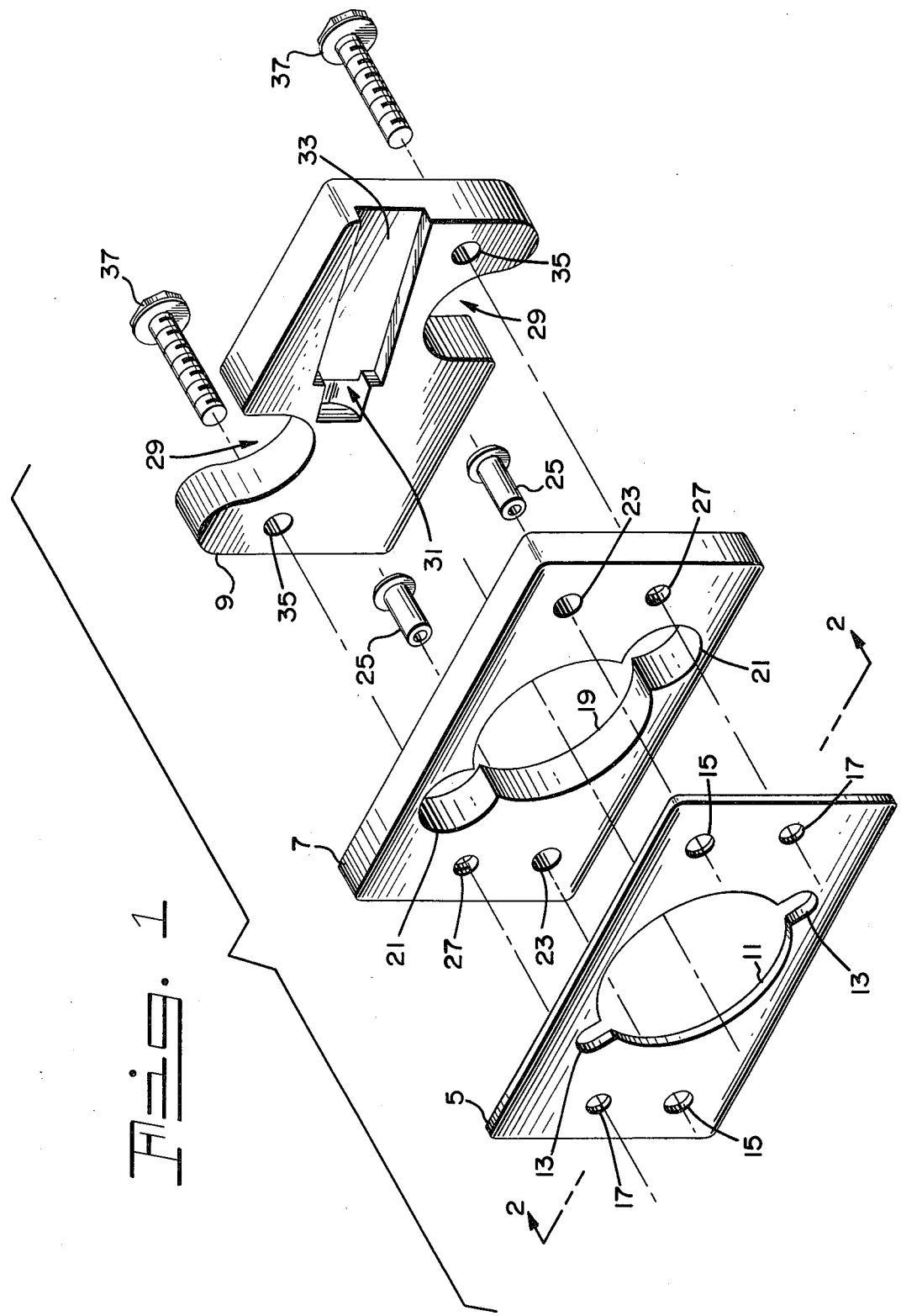
FIG. 1 is an exploded isometric illustration of a preferred embodiment of the invention.

Referring to FIG. 1 of the drawings, a temperature sensor holding device includes a plate member 5, a spacer member 7, and a cover member 9. The plate, spacer, and cover members 5, 7, and 9 all have a common axis and formed for cooperative coupling therebetween.

The plate member 5 is of a substantially rectangular shape and preferably fabricated of an electrical current and thermal conductive metal with a central aperture 11 formed to receive a heat generating semi-conductor device (not shown). A pair of diametrically opposed slots 13 intersect the central aperture 11 and provide passageway for a holding means for the semi-conductor device and the plate member 5 as will be further explained hereinafter. Also, the plate member 5 includes first and second pairs of diametrically opposed holes 15 and 17 formed to receive a fastening means.

The spacer member 7 is substantially rectangular-shaped and of an electrical insulating material such as a molded plastic for example. The spacer member 7 has a central aperture 19 formed for alignment with the central aperture 11 of the plate member 5 and formed to telescope over a heat generating device (not shown) disposed in the central aperture 11. A pair of diametrically opposed openings 21 intersect the central aperture 19 and are aligned with the opposed slots 13 of the plate member 5. These opposed openings 21 are formed to receive a means for fastening the plate member 5 and a semi-conductor device (not shown) to a heat sink. A pair of counter sunk, diametrically opposed holes 23 are aligned with the first pair of holes 15 of the plate member 5 and formed to receive a first fastening means such as a pair of rivets 25. Moreover, the spacer member 7 includes a pair of opposed screw holes 27 aligned with the diametrically opposed holes 17 of the plate member 5.

The cover member 9 is also substantially rectangular-shaped with a pair of openings 29 aligned with the openings 21 of the spacer member 7 and the slots 13 of the plate member 5. The cover member 9 includes an inner surface cut out portion 31 formed to receive a temperature sensor device (not shown). The cut out portion 31 extends outwardly to the perimeter of the cover member 9 and forms a gap 33 intermediate to the spacer and cover members 7 and 9 respectively. A pair of screw holes 35 are aligned with the screw holes 27 of the spacer member 7 and the screw holes 17 of the plate member 5. A second holding means in the form of a pair of screws 37 are provided for cooperation with the screw holes 35, 27, and 17.

Figure 2:
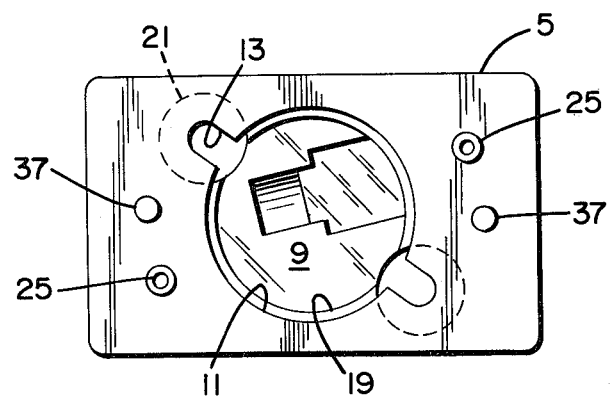
FIG. 2 is a sectional view of the embodiment of FIG. 1 taken along the line 2—2.

As to utilization of the above-described temperature sensor holding device, the plate and spacer members 5 and 7 are affixed to one another by the first fastening means 25. In this instance the fastening means 25 is in the form of rivets although other well-known fasteners are appropriate. As can be seen in FIG. 2, the central aperture 11 of the plate member 5 is aligned with the central aperture 19 of the spacer member 7 and both are aligned with the cut out portion 31 of the cover member 9. Also, the slots 13 of the plate member and the openings 21 of the spacer member 7 are aligned to receive a common fastener.

In assembling the above-described apparatus, an insulator material such as mica is placed in contact with a heat sink and a heat-generating semi-conductor device having a pair of diametrically opposed apertured ear members is placed in contact with the mica. Then, the attached plate and spacer members 5 and 7 are telescoped over the heat-generating semi-conductor device, and a pair of screws (not shown) attach the plate member 5, spacer member 7, and heat-generating semi-conductor device to the heat sink via the openings 21 of the spacer member 7, the slots 13 of the plate member 5 and the apertured ear members of the heat generating semi-conductor device (not shown). Thus, the heat generating semi-conductor device, the plate member 5, and the spacer member 7 are all easily detached from a heat sink by removal of the screws (not shown).

Figure 3:
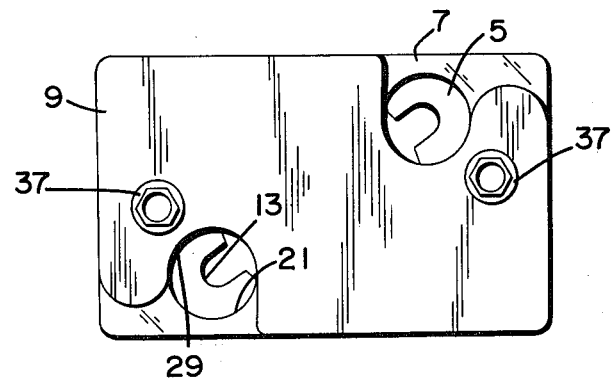
FIG. 3 is a top elevational view of the embodiment of FIG. 1.

Thereafter, the cover member 9 of FIG. 3 is affixed to the spacer member 7 and plate member 5 by the second fastening means in the form of a pair of screws 37. These screws 37 pass through the screw holes 35 of the cover member 9, the screw holes 27 of the spacer member 7, and the holes 17 of the plate member 5. Also, the openings 29 of the cover member 9 permit access to the screws (not shown) passing through the openings 21 of the spacer member 7, the slots 13 of the plate member 5, and the apertured ear members of a heat generating semi-conductor (not shown).

In this manner, a temperature sensor device (not shown) disposed within the cut out portion 31 of the cover member 9 is brought into intimate contact with the heat generating semi-conductor device (not shown) disposed within the apertures 19 and 11 of the spacer and plate members 7 and 5. Also, the gap 33 intermediate to the cover and spacer members 9 and 7 provides strain relief of leads normally extending outwardly from a temperature sensor device disposed within the cut out portion 31 of the cover member 9. The cover member surrounds the heat sensor device and tends to provide thermal insulation for the heat generating semi-conductor and heat sensor devices from ambient temperature conditions of associated electronic apparatus.

Thus, there has been provided a unique temperature sensor holding device having numerous advantages over other known devices. The holding device is easily attachable to and detachable from a heat sink by fastening means normally employed to fasten a heat generating semi-conductor device. Also, a temperature sensor device is readily placed in intimate contact with, replaced, or removed from the vicinity of the heat generating semi-conductor device by a simple fastening or unfastening of the cover member.

Further, the holding device provides thermal shielding of the heat generating semi-conductor and temperature sensor device from ambient thermal conditions while providing intimate contact therebetween and to a heat sink. Moreover, the abovementioned shortened thermal path between the heat generating semi-conductor and temperature sensor device has provided a greatly reduced delay in circuit operation whereby failure of the heat generating semi-conductor due to slow circuit reaction is reduced.

While there has been shown and described what is at present considered a preferred embodiment of the invention, it will be obvious to those skilled in the art that various changes and modifications may be made therein without departing from the invention as defined by the appended claims.

What is claimed is:

1. In electronic apparatus, a temperature sensor holding device comprising:
   plate member means having an aperture therein for receiving a heat generating semi-conductor and formed for attachment to a heat sink;
   spacer member means having an aperture aligned with said aperture of said plate member means and formed to telescope over said heat generating semi-conductor;
   a first holding means connecting said plate and spacer member means;
   cover member means formed for attachment to said plate and spacer member means, said cover member means having a cut out portion on the inner surface thereof aligned with said aperture of said spacer member means and formed to receive a temperature sensor device; and
   a second holding means connecting said cover member means to said spacer and plate member means.

2. The temperature sensor holding device of claim 1 wherein said plate member and spacer member means each include a pair of diametrically opposed holes to provide overlaying of said plate member means by said heat generating semi-conductor and attachment of said plate member means and said heat generating semi-conductor to said heat sink.

3. The temperature sensor holding device of claim 1 wherein said cover member means includes a gap extending outwardly from said cut out portion to the ends of said cover and spacer member means whereby strain relief of leads extending from a temperature sensor device may be provided.

4. A temperature sensor holding device for an electronic apparatus comprising:
   a plate member having a central aperture formed to telescope over a heat generating semi-conductor device;
   a spacer member attached to the plate member, the spacer member having a central aperture formed to telescope over a heat generating semi-conductor device and having a pair of diametrically opposed openings intersecting its central aperture and aligned with a pair of diametrically opposed slots intersecting the central aperture of the plate member;
   fastening means affixing the spacer and plate member to each other and for affixing those members to a heat generating semi-conductor device and to a heat sink; and
   a cover member of electrical insulating material having a cut out portion on the inner surface thereof for receiving a temperature sensor device and for alignment with a heat generating semi-conductor device, the cover member attached to the spacer and plate members so that intimate contact may be effected between the heat generating semi-conductor device and the temperature sensor device.

5. The temperature sensor holding device of claim 4 including a gap intermediate to said spacer and cover members and extending outwardly from said cut out portion on the inner surface of said cover member to the outer edge of said spacer and cover members.

6. The temperature sensor holding device of claim 4 including a first holding means affixing said spacer member to said plate member and a second holding means affixing said cover member to said spacer and plate members.

7. The temperature sensor holding device of claim 6 wherein said first and second holding means are each in the form of a pair of spaced screw members.

* * * * *